(12) United States Patent
Watanabe

(10) Patent No.: US 6,423,144 B1
(45) Date of Patent: Jul. 23, 2002

(54) COATING APPARATUS AND COATING METHOD

(75) Inventor: Masaru Watanabe, Nishinomiya (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/370,227

(22) Filed: Aug. 9, 1999

Related U.S. Application Data

(62) Division of application No. 08/911,354, filed on Aug. 7, 1997, now abandoned.

(51) Int. Cl.⁷ .................................................. B05C 11/00
(52) U.S. Cl. ........................ 118/669; 118/410; 118/419
(58) Field of Search .................................. 118/301, 410, 118/419, DIG. 4, 406, 669, 679, 696, 698; 425/141, 465, 466

(56) References Cited

U.S. PATENT DOCUMENTS

| | | | |
|---|---|---|---|
| 3,354,867 A | * 11/1967 | Pomper et al. ............. | 118/301 |
| 3,359,941 A | * 12/1967 | Sible ...................... | 118/DIG. 4 |
| 4,559,896 A | * 12/1985 | Bossard et al. ......... | 118/DIG. 4 |
| 5,044,307 A | * 9/1991 | Takahashi et al. ..... | 118/DIG. 4 |
| 5,575,851 A | * 11/1996 | Abe et al. ................ | 118/410 |
| 5,893,951 A | * 4/1999 | Madrzak et al. ........... | 118/413 |
| 6,139,637 A | * 10/2000 | Takahashi et al. .......... | 118/410 |

FOREIGN PATENT DOCUMENTS

JP    08224527    9/1996

\* cited by examiner

Primary Examiner—Brenda A. Lamb
(74) Attorney, Agent, or Firm—Smith, Gambrell & Russell

(57) ABSTRACT

A coating method has running step of running a nozzle and/or a base material, change step of changing discharge-port slit widths of said nozzle, and coating step of discharging a coating solution from said slit and coating said base material with said coating solution; wherein said running step, change step, and coating step are executed by combining them.

2 Claims, 19 Drawing Sheets

Base material running direction

Base material running direction

Base material rotating direction

COATING APPARATUS AND COATING METHOD

This application is a division of application Ser. No. 08/911,354, filed on Aug. 7, 1997 now abandoned. This related application is relied on and incorporated herein by reference in its entirety.

BACKGROUND OF THE INVENTION

1. Field of the Invention

The present invention relates to a coating apparatus and a coating method for applying a resist solution to be coated on the substrate of a semiconductor, liquid crystal, PDP, or printed circuit board, coating solution for an insulating layer or protective layer, or coating solution for a color filter onto a substrate in an optional pattern such as circle, approximate circle, or polygon.

2. Related Art of the Invention

The spin coating method is generally known as a resist-solution coating method used for a fabrication process of a liquid crystal or semiconductor. FIG. 30 shows the theory of the spin coating method. In FIG. 30, symbol 50 denotes a base material, 51 denotes a turntable with a vacuum chuck, 52 denotes a motor and a speed converter, 53 denotes a syringe. First, the base material 50 is fixed onto the turntable 51 with a vacuum chuck to drop a resist solution onto the base material 50 from the syringe 53. Then, by rotating the base material 50 at a high speed (normally, thousands of rpm) by the motor and speed converter 52 connected to the turntable, resist is thinly applied to the surface of the base material due to a centrifugal force. The method disclosed in the official gazette of Japanese Patent Laid-Open No. 224527/1996 is known as another spin coating method.

However, the conventional spin coating method has a problem that, when applying resist onto an approximately-circular wafer almost circularly, most of an expensive resist solution is scattered and thus, the material loss greatly increases. Moreover, a coating thickness becomes irregular depending on the viscosity of a coating solution and this causes a problem on the product quality.

SUMMARY OF THE INVENTION

It is an object of the present invention to provide a coating apparatus and a coating method for applying a coating solution to a base material or a substrate in an optional pattern such as a rectangle, square, circle, polygon, or combination of a circle and a polygon, or approximate circle, greatly decreasing the loss of the coating solution, and uniforming the coating thickness.

To achieve the above object, the first invention comprises the running step of running a nozzle and/or a base material, changing step of changing the discharge port slit width of the nozzle, and coating step of discharging a coating solution from the slit and coating the base material with the coating solution, in which the running step, the changing step, and the coating step are executed by combining them. To control a coating thickness to a purposed thickness, the first invention further comprises the supply quantity control step of controlling the supply quantity of the coating solution in accordance with the slit width of the nozzle. Furthermore, it is possible to apply a coating solution at a uniform coating thickness in an optional pattern of a circle or polygon while keeping the pressure in the nozzle and the gap between the base material and the nozzle constant and thereby, substantially decrease the loss of the coating solution to zero.

The second invention comprises blocking means movable in a coating width direction to control the discharge port slit width of a nozzle and driving means obtained by combining a moving unit for moving the blocking means with a controller for controlling the moving distance. The blocking means moves in the nozzle and has a bar interlocking with the blocking means. The bar is present in the manifold of the nozzle and the discharge port slit width is controlled by the lateral of the bar and the blocking plate. When assuming the cross section of the bar in the. direction (X) substantially intersecting the moving direction of the bar as A and the cross section of the internal space of the manifold in the nozzle in the direction (X) as B, an inequality A#B/2 is effected. When the above relation between A and B is satisfied, the problem is solved that a coating solution enters the space in the nozzle formed due to movement of the blocking means to interrupt uniform coating. Therefore, it is possible to apply the coating solution at a uniform thickness in an optional pattern such as a circle or polygon and moreover substantially decrease the loss of the coating solution to zero.

The third invention makes it possible to apply a coating solution to a base material while rotating a nozzle having a discharge port slit gradually widened from the central portion toward the both ends in a coating width direction of the slit and/or a base material about the center of the nozzle in a coating width direction of the nozzle. Therefore, it is possible to uniform the coating thickness on a circular pattern and moreover substantially decrease the loss of a coating solution to zero.

The fourth invention applies a coating solution to a base material while rotating a nozzle having a discharge port slit gradually widened from one end toward the other end in a coating width direction of the slit and/or a base material about the narrowest end of the slit of the nozzle. Therefore, it is possible to uniform the coating thickness on a circular pattern and moreover, substantially decrease the loss of the coating solution.

The fifth invention discharges a coating solution from a slit and moves means for receiving the coating solution provided nearby the discharge port of the slit in a coating width direction. Because a gap is formed between the coating-solution receiving means and the discharge port of the slit, a desired pattern can be applied by removing the coating solution at a portion which should not be coated by the coating-solution receiving means.

The sixth invention discharges a slight amount of coating solution from a slit discharge port immediately before coating, discharges an amount of coating solution corresponding to a predetermined coating thickness from the slit to form a coating film on a base material, and stops the discharge of the coating solution from the slit at the coating end of the base material. The amount of coating solution discharged from the slit discharge port immediately before coating ranges between 0.001 and 1 cc and this amount of coating solution corresponds to an amount of coating solution for filling the gap between the slit discharge port and the base material. Thereby, it is possible to prevent a critical problem that a coating thickness decreases at the coating start end especially at the start of coating or a coating solution contains air and make the coating thickness from the coating start end up to the coating termination end uniform.

As described above, the present invention makes it possible to apply a coating solution onto a substrate with no loss of the coating solution at a uniform coating thickness in an optional pattern and moreover, greatly decrease the cost and improve the product quality in a field of semiconductor or liquid crystal requiring a resist process.

PREFERRED EMBODIMENTS

Figure 1:
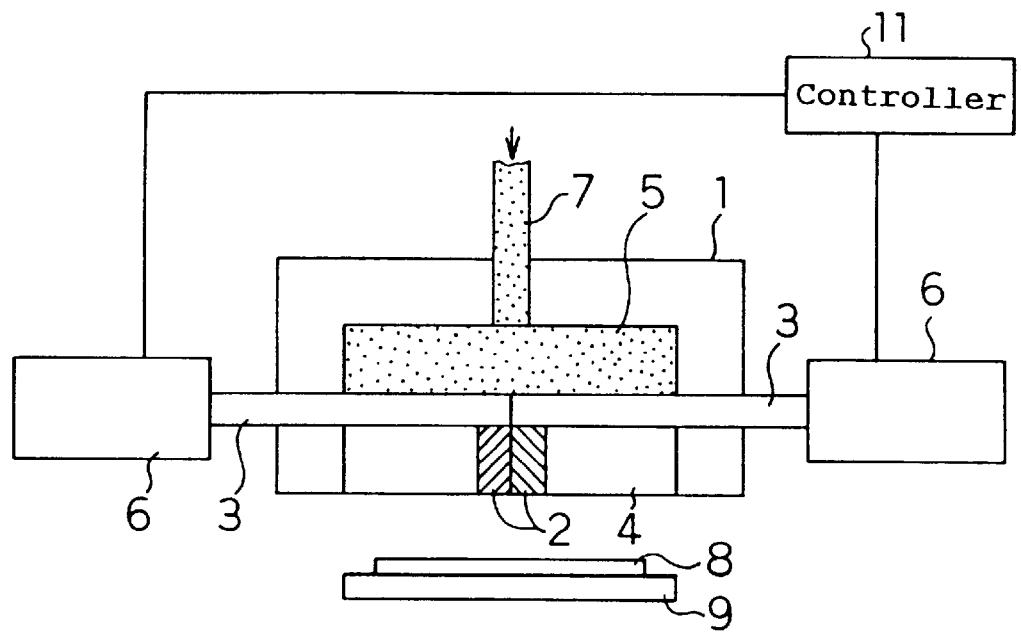
FIG. 1 is a schematic block diagram showing the coating method of the first embodiment of the present invention.

The present invention is described below by referring to the accompanying drawings showing the preferred embodiments.

Embodiment 1

FIGS. 1 to 6 show schematic views of an apparatus for executing a coating method of the first embodiment of the present invention.

The structure of an apparatus for executing a coating method of the first embodiment of the present invention is described below. A nozzle 1 is provided with a pair of right and left blocking plates 2 with a thickness slightly smaller than the gap of a slit 4 and the blocking plates 2 are secured to a bar 3. An end of the bar 3 is provided with a moving unit 6 for moving the bar 3 in a coating width direction. Though the moving unit 6 is not restricted, it can use any mechanism such as a mechanism constituted by combining a servo motor, gear, and belt as long as the mechanism can change coating widths by moving the bar 3 and the blocking plates 2 by a controller 11 in accordance with a program stored in the controller 11.

Figure 2:
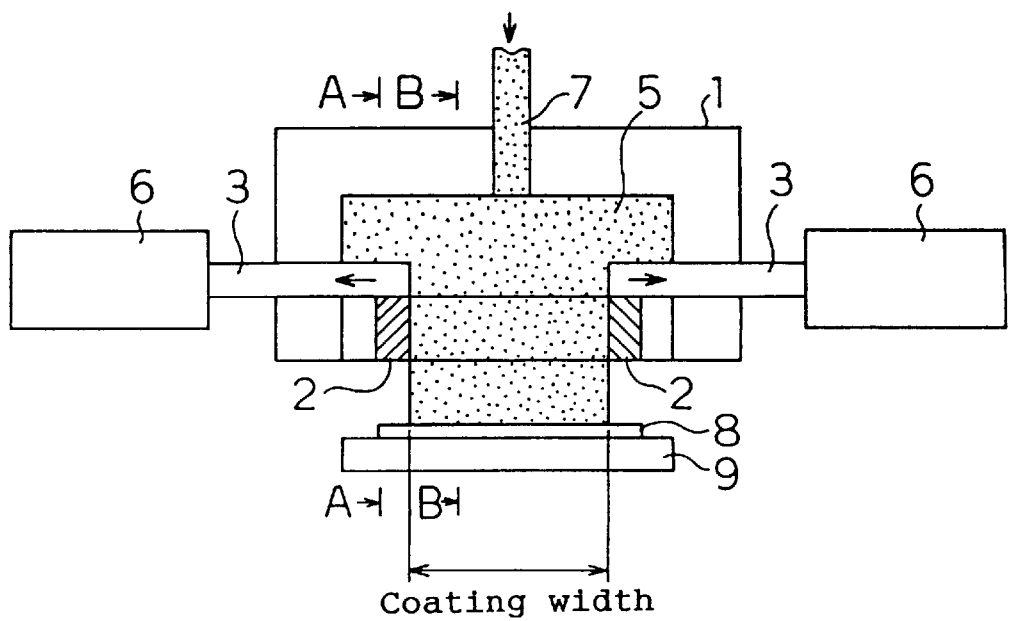
FIG. 2 is a schematic block diagram showing the coating method of the first embodiment of the present invention.
Figure 3:
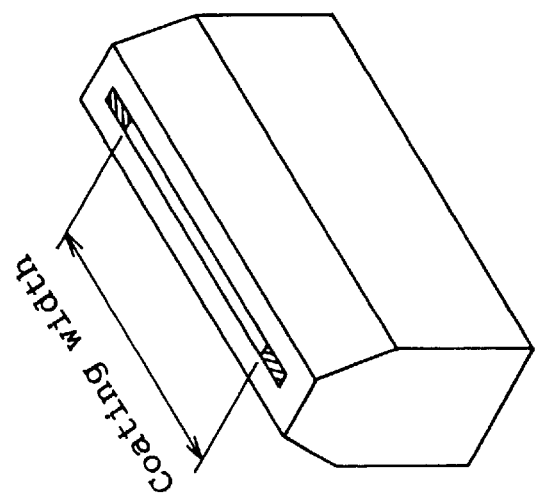
FIG. 3 is a perspective view of the nozzle of the first embodiment of the present invention.
Figure 3:
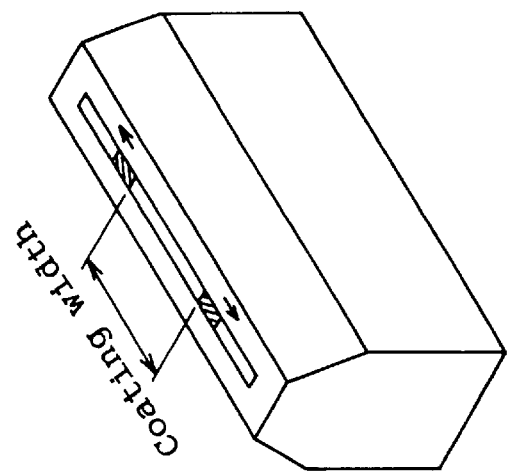
Figure 3:
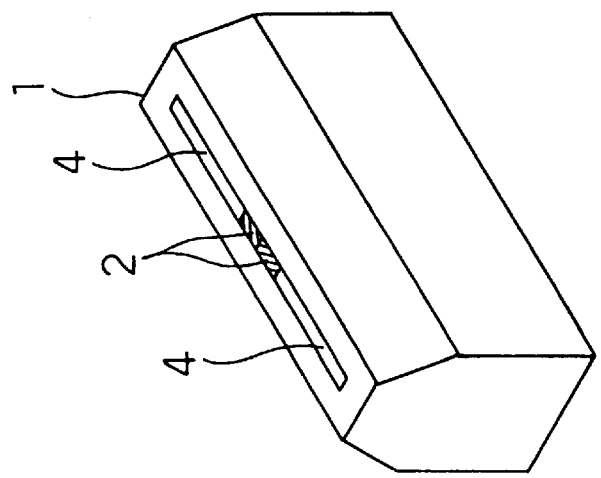
Figure 4:
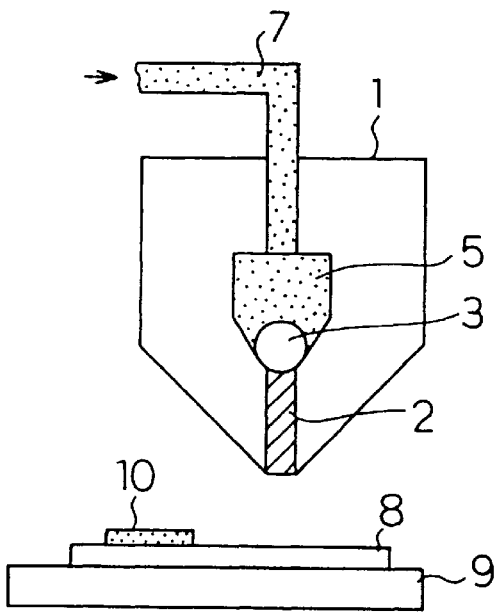
FIG. 4 is a sectional view of the coating portion of the first embodiment of the present invention.
Figure 5:
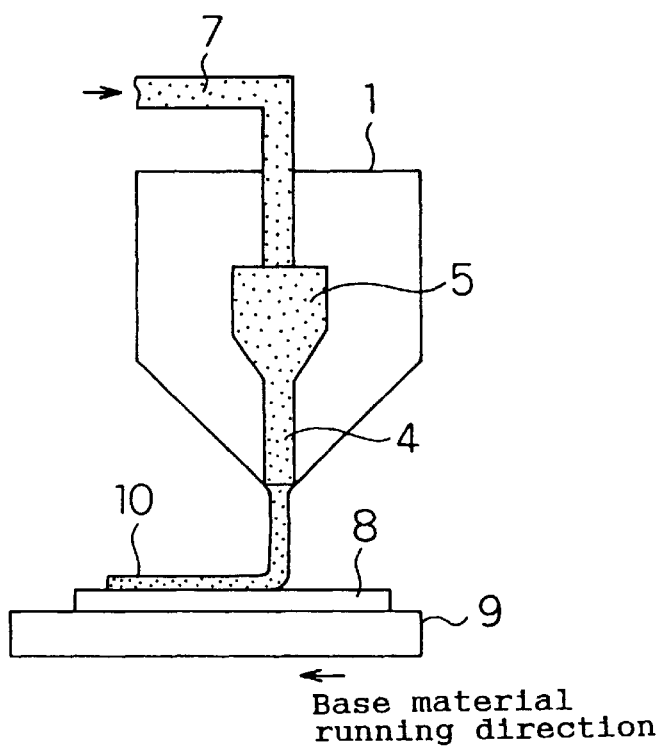
FIG. 5 is a sectional view of the coating portion of the first embodiment of the present invention.
Figure 6:
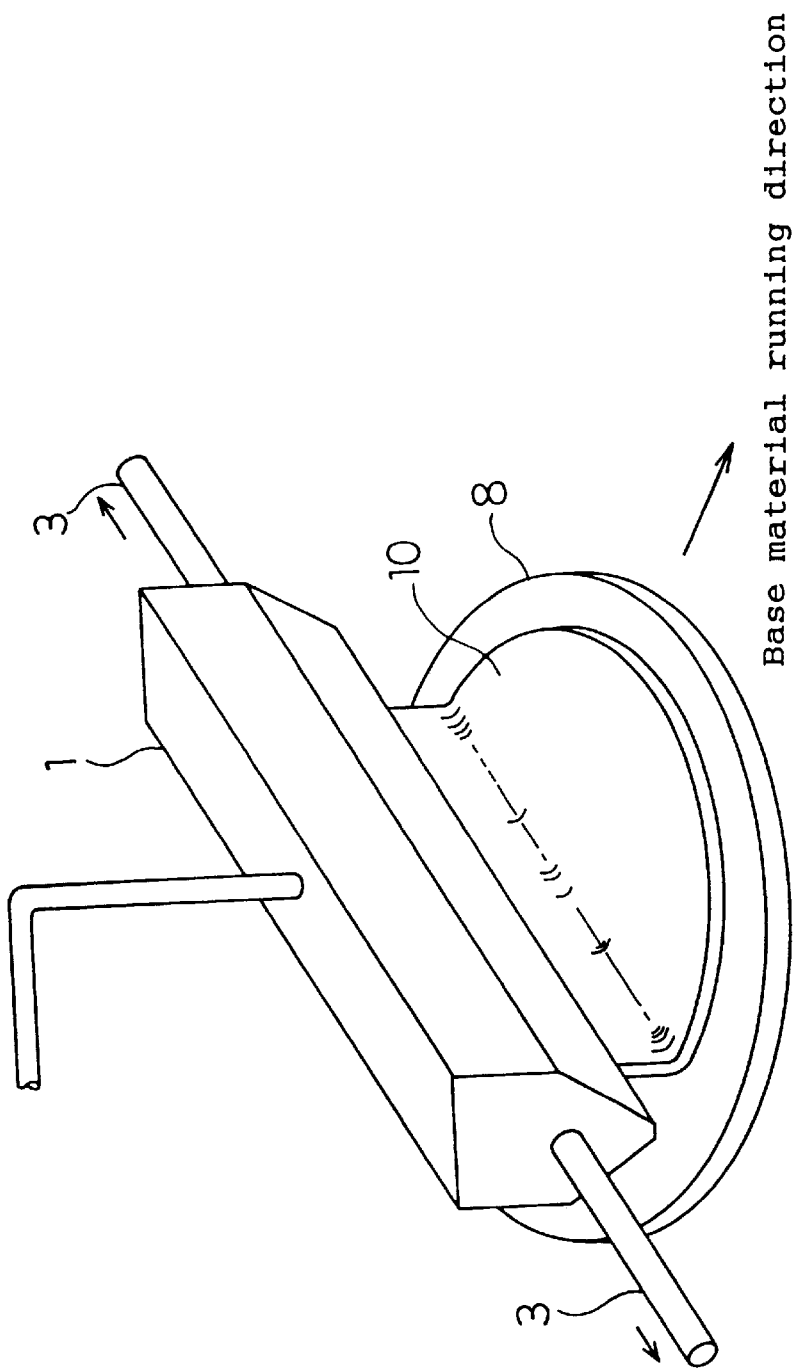
FIG. 6 is a perspective view showing the coating method of the first embodiment of the present invention.

A coating method of the first embodiment of the present invention is described below together with operations of the above apparatus. A coating solution 7 is sent into a manifold 5 of the nozzle 1 by a solution transfer system such as a force feed system, pump system, or cylinder system, uniformly discharged from the slit 4 in a coating width direction, and coated on a base material 8 set onto a table 9. Coating widths are changed by moving the blocking plates 2 from the central portion of the nozzle 1 to right and left and thereby changing coating widths. FIGS. 1 and 2 show the above state. It is possible to change the moving distances of the bar 3 during coating in accordance with the program stored in the controller 11. FIG. 3 is an illustration of the nozzle 1 viewed from the discharge port side of the coating solution 7, showing a state of gradually increasing a coating width from 0 by moving the blocking plates 2. FIGS. 4 and 5 are sectional views A—A and B—B in FIG. 2 viewed from the direction of the arrows in FIG. 2. As shown in FIG. 4, to form a portion not to be coated, it is prevented that the coating solution 7 is ejected to the portion not to be coated by blocking the entrance of the slit 4 by the periphery of the bar 3. Therefore, a coating width is determined by the positions of the blocking plates 2 in their width direction, the coating width can be optionally changed by moving the blocking plates 2, and coating can be made in an optional pattern corresponding to the change of the coating width. Moreover, when changing the coating width, to make a coating thickness constant, it is necessary to adjust an amount of coating solution to be supplied to the nozzle in accordance with the coating width and change the discharge amount of coating solution. In this case, by controlling the manifold pressure so as to be constant, the discharge amount of the coating solution 7 for unit width becomes constant because the resistance between gaps between the slit 4, base material 8, and nozzle 1 is constant. Therefore, even if coating widths are changed, it is possible to further uniform a coating thickness. Moreover, to make a coating thickness on the base material constant, it is important to keep the gap between the nozzle 1 and the base material 8 constant. If the gap fluctuates, the fluctuation in coating thickness increases. For example, when the gap is widened, the coating thickness locally increases though the discharge quantity is constant. In the case of this embodiment, a mechanism for keeping a gap constant is not restricted. For example, however, it is also possible to use means for keeping a gap constant by fixing the nozzle 1 and moving the table 9 fixing the base material 8 on a surface plate. FIG. 6 is a schematic view showing that resist serving as the coating solution 7 is substantially circularly applied onto the base material 8 by this embodiment. In this case, a preferable uniformity at a coating thickness of 1:m after drying is obtained and the thickness fluctuation is kept within "1% and moreover, the loss of the resist can be decreased to zero by this embodiment.

Means for supplying a coating solution to the nozzle 1 is further described below.

Figure 8:
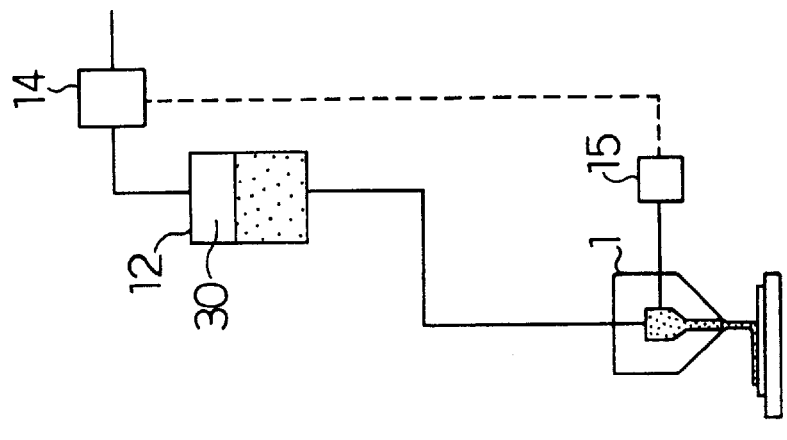
FIG. 8 is a schematic block diagram showing the coating-solution supply system of the first embodiment of the present invention.

As shown in FIG. 8, a signal related to the solution pressure in a manifold obtained from a liquid-pressure sensor 15 is returned to a pressure control valve 14 provided for a gas pipe for pressurizing a tank 12. By adjusting pressure control valve 14 and thereby changing the gas pressure, the pressure of the coating solution 7 to be supplied to the nozzle 1 is changed and the amount of the coating solution 7 to be supplied to the nozzle 1 is changed so that the pressure in the nozzle 1 gradually changing coating widths becomes constant. By changing the amount of the coating solution 7 to be supplied to the nozzle 1 in accordance with a coating width, it is possible to keep the liquid pressure in the manifold 5 constant and change the amount of the coating solution 7 discharged from the nozzle 1 to a value corresponding to a coating width. The discharge quantity from the nozzle 1 is determined by the resistance due to a slit when the pressure in the manifold 5 is constant. Therefore, when a slit width is small, that is, a coating width is small, the discharge quantity also becomes small. Thereby, even if the coating width is changed, it is possible to make a coating thickness constant by keeping the discharge quantity for unit width constant.

Figure 9:
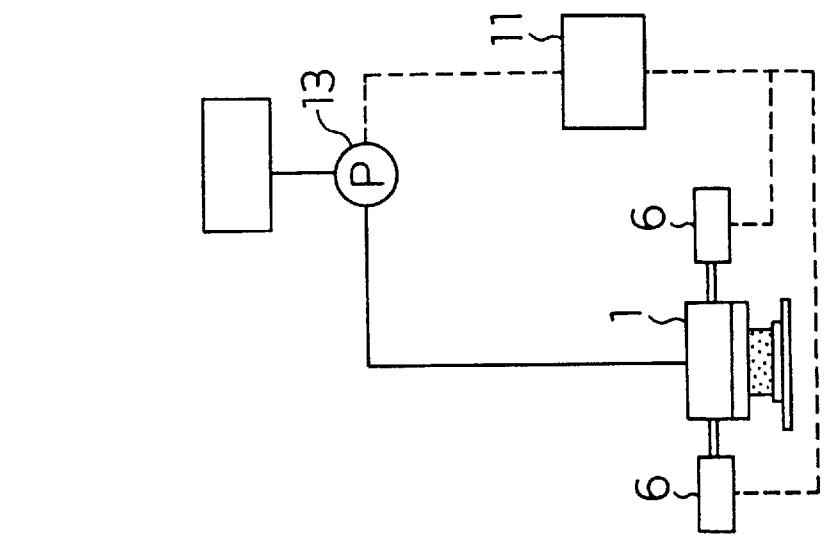
FIG. 9 is a schematic block diagram showing the coating-solution supply system of the first embodiment of the present invention.

Moreover, as shown in FIG. 9, it is possible to control a pump 13 for supplying the coating solution 7 to the nozzle 1 by the controller 11 for controlling the moving unit 6 for changing slit widths synchronously with the change of the coating width and thereby change amounts of the coating solution 7 to be supplied. Specifically, amounts of the coating solution 7 to be supplied to the nozzle 1 are changed in accordance with a signal from the controller 11 by using a quantitative pump such as a precision gear pump, bellows pump, diaphragm pump, or piston pump as the pump 13.

Figure 10:
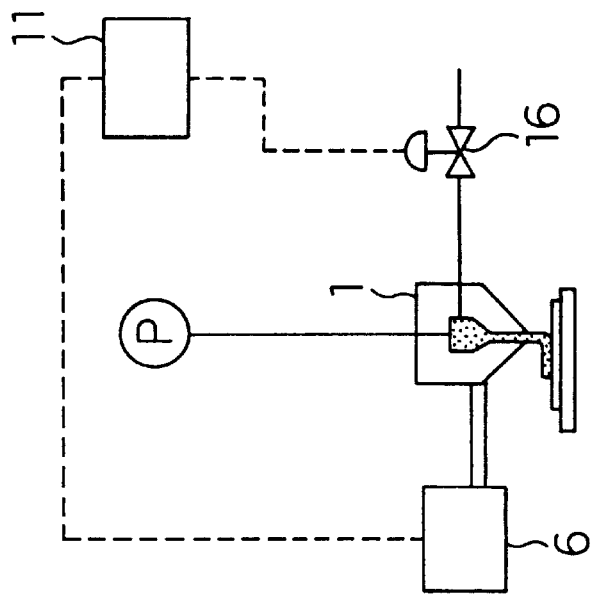
FIG. 10 is a schematic block diagram showing the coating-solution supply system of the first embodiment of the present invention.

Moreover, as shown in FIG. 10, a flow control value 16 for discharging the coating solution 7 from the nozzle 1 is provided for the nozzle 1 and connected to the controller 11. It is not necessary to provide the flow control valve 16 directly for the nozzle 1 but it is also possible to provide the valve 16 for a coating-solution supply pipe between the pump and the nozzle 1. A certain amount of the coating solution 7 is constantly supplied to the nozzle 1 from the tank through force feed or by a pump. In this case, the pump can use any one of quantitative pumps such as a precision gear pump, bellows pump, diaphragm pump, and piston pump. The coating solution 7 is discharged so that the discharge quantity for unit width of the nozzle 1 becomes constant by changing the coating width of the nozzle 1 and simultaneously adjusting the opening degree of the flow control valve 16 in accordance with a signal from the controller 11.

Figure 11:
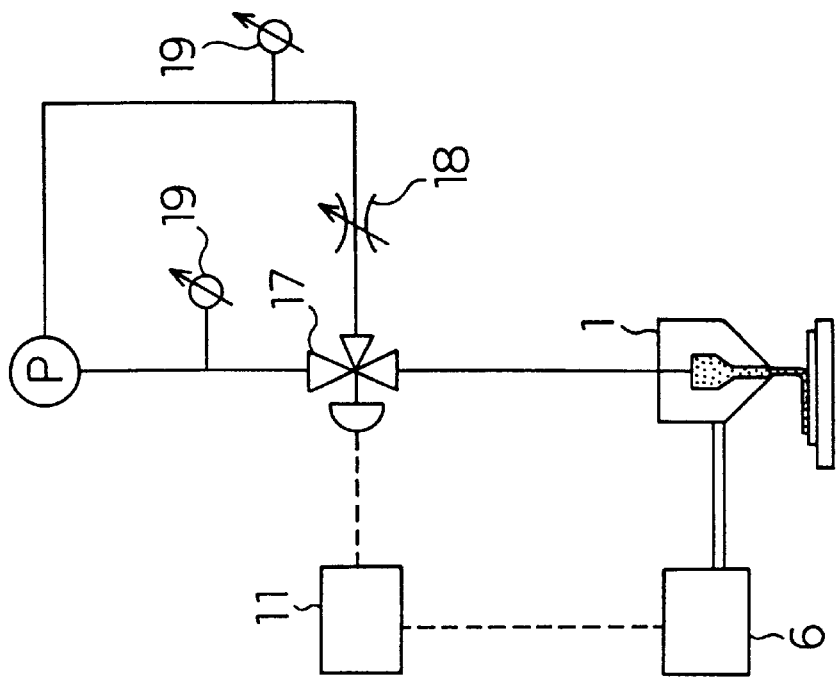
FIG. 11 is a schematic block diagram showing the coating-solution supply system of the first embodiment of the present invention.

Furthermore, as shown in FIG. 11, a three-way valve 17 is set between the pump of the supply pipe and the nozzle 1 so that one side serves as a part of the supply pipe to be connected to the nozzle 1 and the other side serves as a branch pipe to be returned to the pump. Moreover, the branch pipe is provided with a flow control valve 18 and further, two pressure gauges 19 are set, one between the flow control valve 18 of the branch pipe and the pump and the other between the pump of the supply pipe and the three-way valve 17. The coating solution 7 is continuously supplied but it is returned to the pump through the branch pipe when coating is not performed. Supply of the solution to the nozzle 1 is started by switching the three-way valve 17 in accordance with a signal from the controller 11 and thus, coating is started. Moreover, it is necessary to previously fill the nozzle 1 with the coating solution 7. The liquid pressure in the coating-solution supply portion is equalized with that in the branch pipe by the flow control valve 18 when coating is not performed and moreover, the liquid pressure in the coating-solution supply portion when coating is performed is also equalized with the above liquid pressure. Thereby, the liquid pressure in the manifold 5 is kept constant immediately after start of coating and immediately before end of coating. As a result, it is possible to uniform a coating thickness constantly and uniform the coating thickness on the entire coating portion. Thus, it is possible to prevent that a coating start end or a coating termination end becomes thicker or thinner than a purposed coating thickness due to the fact that pressure greatly rises immediately after a pump is started at start of coating. Thereby, it is possible to uniform the coating thickness on a base material even immediately after start of coating or immediately before end of coating. A certain amount of the coating solution 7 must be constantly supplied to the nozzle 1 by using force feed or a pump as means for supplying the coating solution 7 to the nozzle 1. In this case, the pump can use any one of the quantitative pumps such as a precision gear pump, bellows pump, diaphragm pump, and piston pump.

In the case of this embodiment, it is possible to further uniform the coating thickness on a base material by changing the amount of the coating solution 7 to be supplied to the nozzle 1 in accordance with the change of a coating width and simultaneously keeping the liquid pressure in the manifold 5 constant and keeping the gap between the nozzle 1 and the base material 8 constant. Moreover, to apply resist onto a substantially-circular wafer substantially circularly, it is possible to effectively apply the resist onto the wafer without excessively using expensive resist solution like the conventional spin coating method and moreover, greatly decrease the cost. Furthermore, it is possible to apply the resist solution in an optional pattern.

Embodiment 2

FIGS. 1 to 6 and FIG. 12 show schematic views of the coating apparatus of the second embodiment of the present invention.

Figure 12:
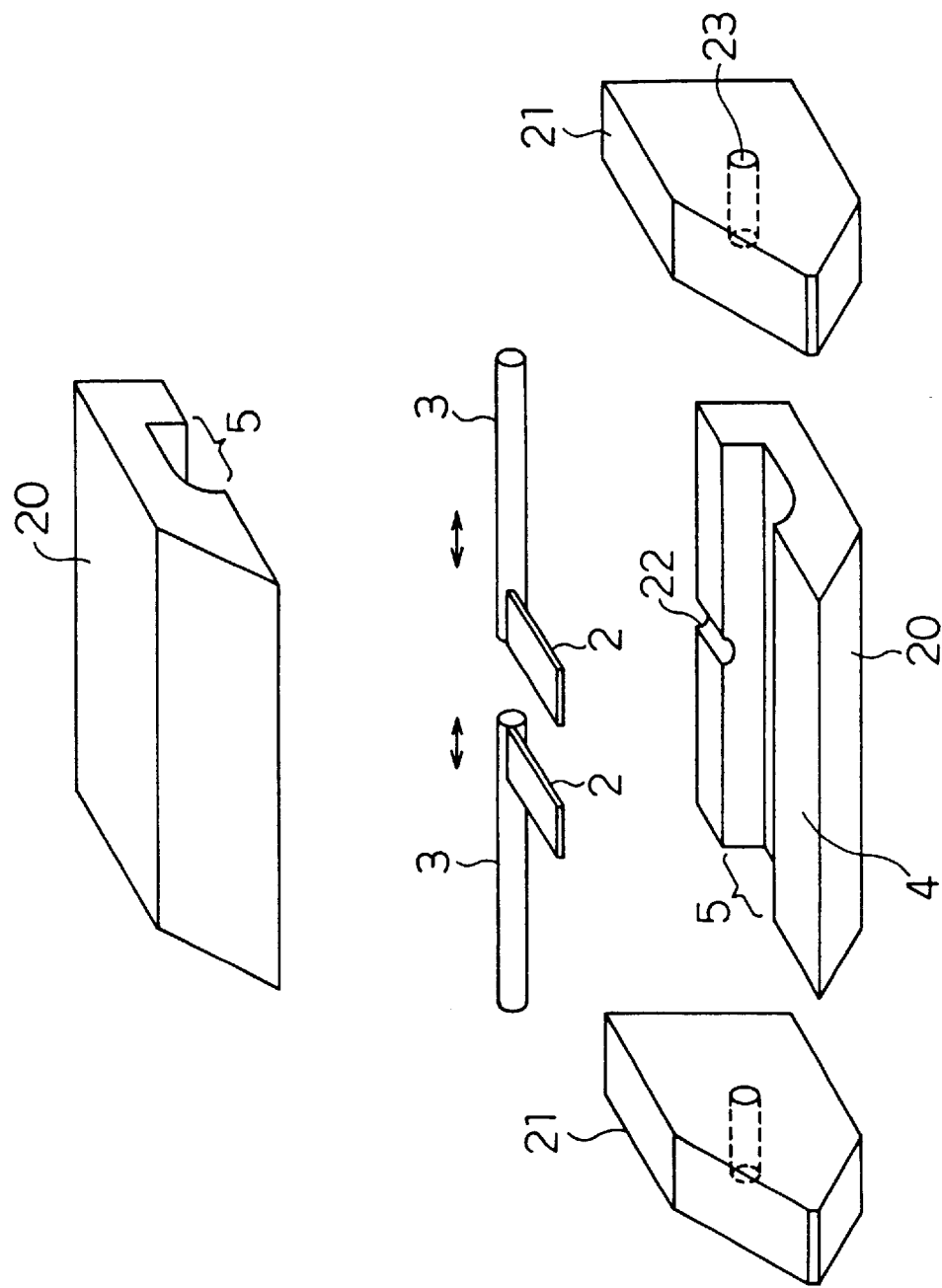
FIG. 12 is a perspective view showing the disassembled nozzle of the second embodiment of the present invention.

The structure of the coating apparatus of the second embodiment of the present invention is described below. A pair of right and left blocking plates 2 are used which is slightly thinner than the gap of the slit 4, the blocking plates 2 are secured to the bar 3, and the bar 3 connects with the moving unit 6 for moving the bar 3 in a coating width direction. The moving unit 6 can use any mechanism constituted by combining a servo motor, gear, and belt as long as the mechanism can change coating widths in accordance with a program stored in the controller 11. It is possible to change the moving distances of the bar 3 during coating in accordance with the program stored in the controller 11. The nozzle 1, as shown in FIG. 12, comprises two body blocks 20, a pair of right and left side blocks 21, and the blocking plates 2 secured by a pair of right and left bars 3. A hole 23 through which each bar 3 passes is provided for each side block 21. Moreover, each body block 20 is provided with a coating-solution supply vent 22. It is not always necessary to use the bar 3 and the blocking plate 2 as a pair of right and left ones. It is permitted to use only either one depending on a coating pattern. It is necessary to make the thickness of each blocking plate 2 slightly smaller than the gap of the slit 4. For example, when the slit gap is 100:m, it is necessary to set the thickness of the blocking plate 2 to a value in a range of 50 to 95:m. When assuming the cross section of the bar 3 as A and that of the manifold as B, A must be equal to or less than B/2.

Operations of the coating apparatus of this embodiment are described below. In FIGS. 1 and 2, the coating solution 7 is supplied to the manifold 5 of the nozzle 1 by a liquid transfer system described in the embodiment 1 such as a force feed system, pump system, or cylinder system, uniformly discharged from the slit 4 in a coating width direction, and applied onto the base material 8 set on the table 9. Coating widths are changed by moving the blocking plates 2 to right and left from the central portion of the nozzle 1 and thereby changing slit widths. FIG. 3 is an illustration of the nozzle 1 viewed from the discharge port side of the coating solution 7, showing the state in which the coating width is gradually increased by moving the blocking plates 2. FIGS. 4 and 5 are cross sections A—A and B—B in FIG. 2. As shown in FIG. 4, to form a portion not to be coated, ejection of the coating solution 7 from the slit 4 is stopped by blocking the entrance of the slit 4 by the periphery of the bar 3. Therefore, it is possible to optionally change coating widths by moving the blocking plates 2. In this case, it is necessary to set the cross section of the bar 3 to 50 mm² or less when the cross section of the manifold 5 is 100 mm². If the cross section of the bar 3 exceeds the range, a space is produced when the plates 2 move in the manifold 5 and the coating solution 7 in the manifold 5 enters the space to fill it and thus, the coating solution 7 is not uniformly discharged from the slit 4. From the study by the inventor of the present invention et al., it is found that discharge of the coating solution 7 during movement of the blocking plates 2 is less influenced by minimizing the cross section of the bar 3. Moreover, to keep the coating thickness on the base material constant, it is important to make the gap between the nozzle 1 and the base material 8 constant. When the gap fluctuates, for example, the gap is widened, the coating thickness locally increases though a discharge quantity is constant. In the case of this embodiment, a mechanism for keeping the gap constant is not restricted. However, it is also possible to use means for keeping the gap constant by fixing the nozzle 1 and moving the table 9 with the base material 8 fixed on a surface plate.

FIG. 6 is a schematic view showing the state in which resist serving as the coating solution 7 is almost circularly applied onto the base material 8 by this embodiment. The coating thickness is 1:m after drying, the thickness fluctuation is kept within "1%, and the loss of the resist can be decreased to zero by this embodiment.

This embodiment makes it possible to further uniform the coating thickness on a base material by changing amounts of a coating solution to be supplied to the nozzle 1 in order to keep a coating thickness constant in accordance with the change of slit widths of the nozzle 1 and simultaneously keeping the liquid pressure in the manifold 5 constant, keeping a relation of A#B/2 when assuming the cross section of the bar 3 as A and that of the manifold as B, and keeping the gap between the nozzle 1 and the base material 8 constant. Moreover, to apply resist onto a substantially circular wafer substantially circularly, it is possible to effectively apply the resist onto the wafer without excessively using expensive resist like the conventional spin coating method and thus, greatly decrease the cost. Furthermore, it is possible to perform coating in an optional pattern.

Embodiment 3

FIGS. 13 to 18 show schematic views of the coating apparatus of the third embodiment of the present invention.

Figure 18:
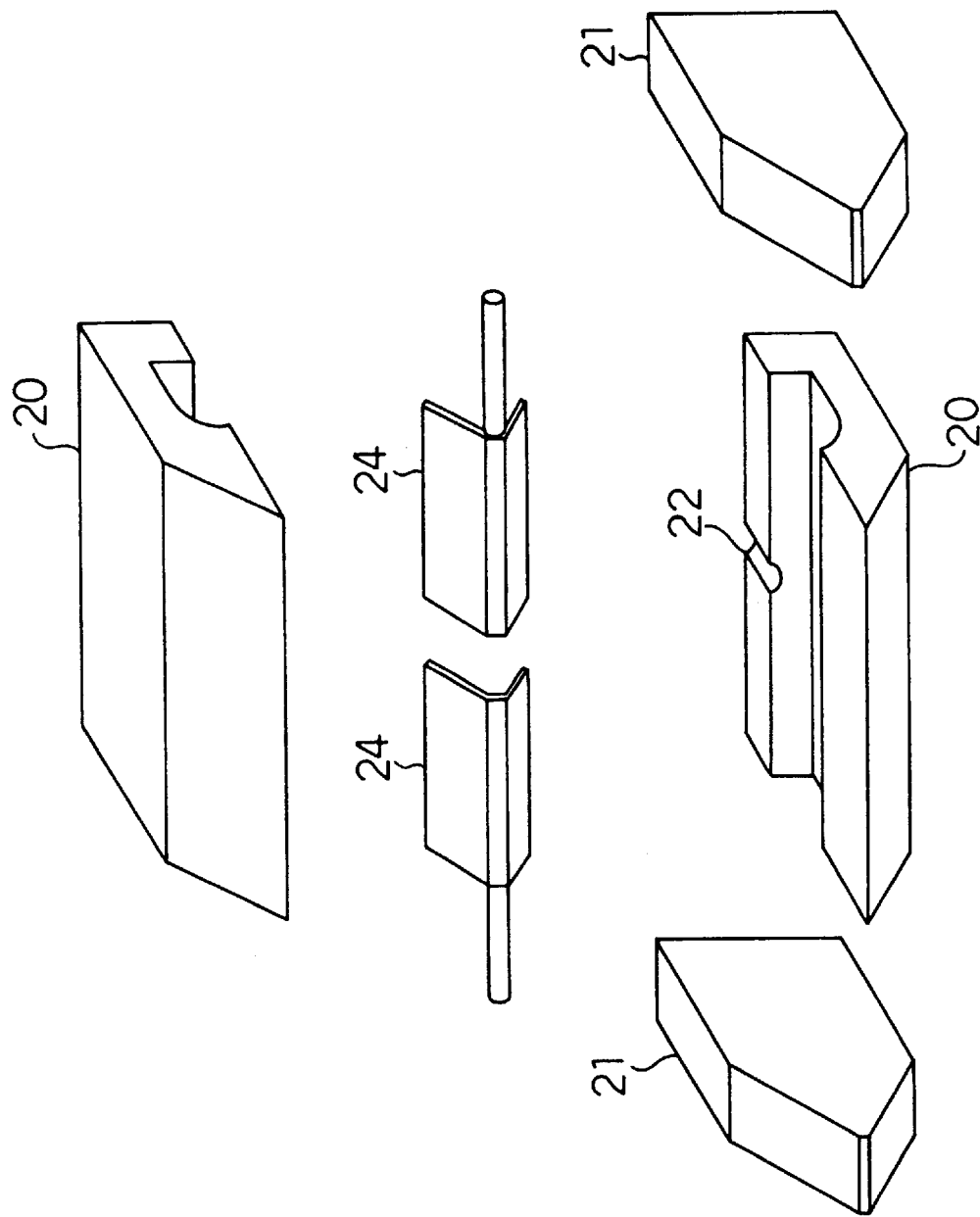
FIG. 18 is a perspective view showing the disassembled nozzle of the third embodiment of the present invention.

The structure of the coating apparatus of the third embodiment of the present invention is described below. A blocking plate 24 connects with a moving unit 6 for moving the blocking plate 24 in a coating width direction. The blocking plate 24 can be also connected to the moving unit 6 through a bar as shown in FIG. 18. The moving unit 6 is not restricted. The unit 6 can use any mechanism such as a mechanism constituted by combining a servomotor, gear, and belt as long as the mechanism can change coating widths in accordance with a program stored in a controller 11. It is possible to change the moving distances of the blocking plate 24 during coating in accordance with the program stored in the controller 11. Moreover, a nozzle 1 comprises two body blocks 20, a pair of right and left side blocks 21, and the blocking plate 24 secured to a pair of right and left bars as shown in FIG. 18. Each body block 20 is provided with a coating-solution supply vent 22. It is not always necessary to use the bar and the blocking plate 24 as a pair of right and left ones. It is permitted to use only either one depending on a coating pattern. It is necessary to make the thickness of the blocking plate 24 slightly smaller than the gap between the front end of the nozzle 1 and a base material 8. For example, when the gap is 100:m, the thickness of the blocking plate must be set to a value in a range of 50 to 95:m.

Figure 13:
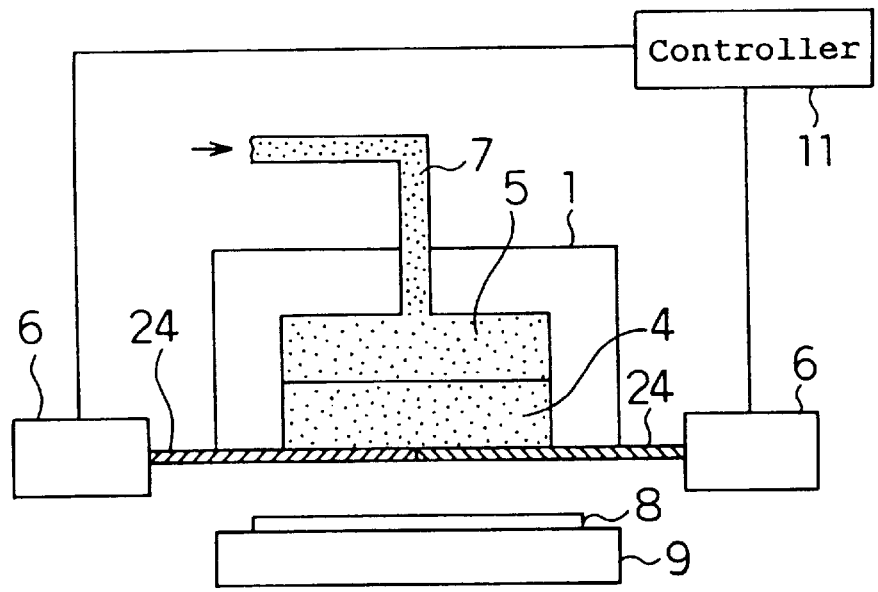
FIG. 13 is a schematic block diagram showing the coating method of the third embodiment of the present invention.
Figure 14:
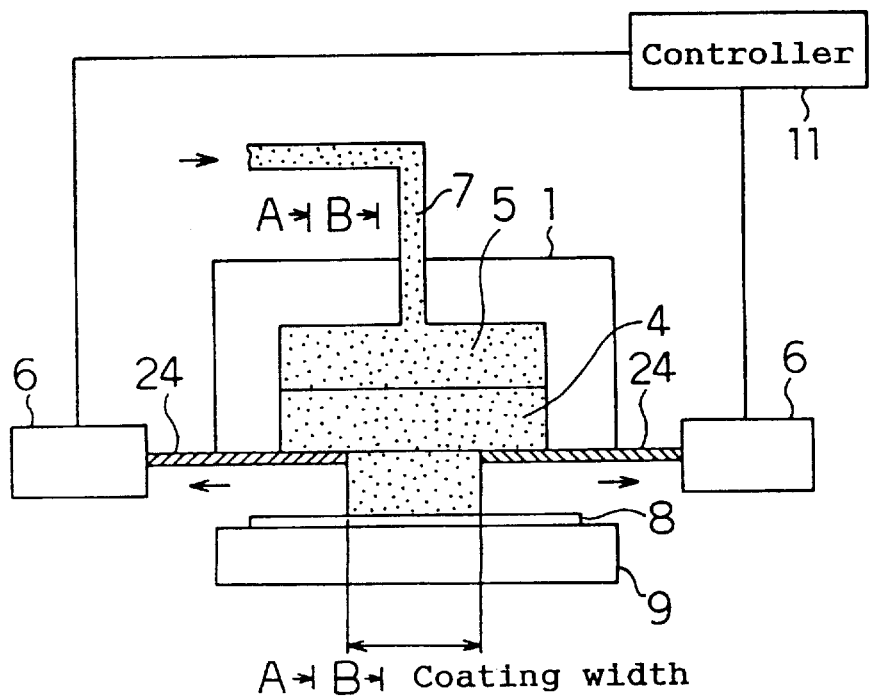
FIG. 14 is a schematic block diagram showing the coating method of the third embodiment of the present invention.
Figure 15:
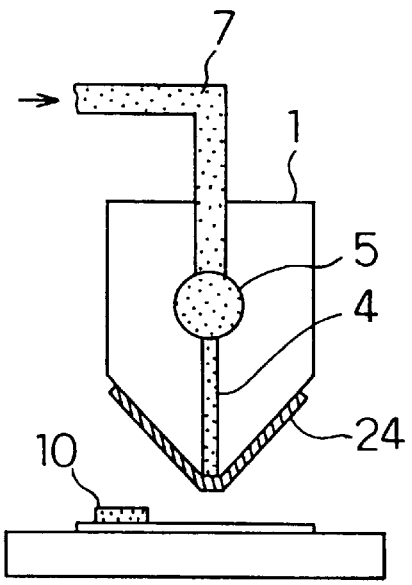
FIG. 15 is a sectional view of the coating portion of the third embodiment of the present invention.
Figure 16:
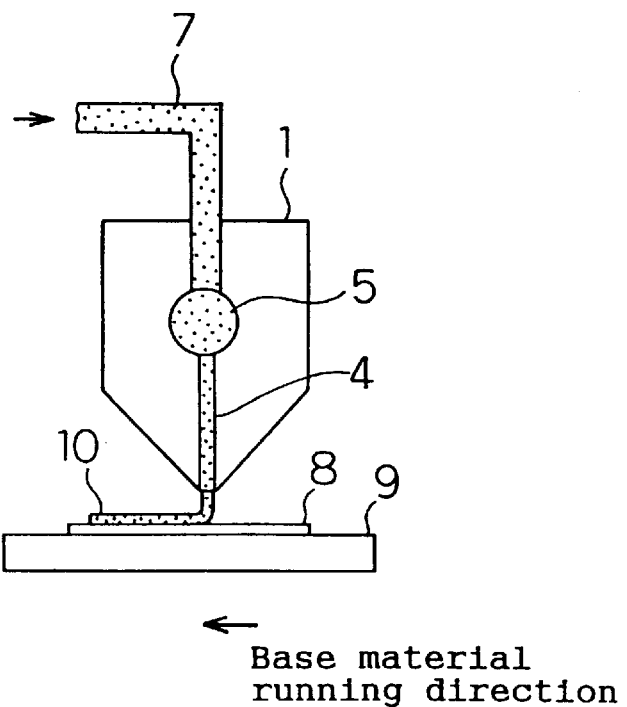
FIG. 16 is a sectional view of the coating portion of the third embodiment of the present invention.

Operations of the coating apparatus of this embodiment are described below. In FIGS. 13 and 14, the coating solution 7 is supplied to a manifold 5 of the nozzle 1 by a liquid transfer system such as a force feed system, pump system, or cylinder system, uniformly discharged from a slit 4 in a coating width direction, and applied onto the base material 8 set on a table 9. Coating widths can be changed by moving a pair of right and left blocking plates 24 from the central portion of the nozzle 1 to right and left at the exit portion of the slit 4 and changing slit widths. FIGS. 15 and 16 are cross sections A—A and B—B in FIG. 14. As shown in FIG. 15, to form a portion not to be coated, ejection of the coating solution 7 from the slit 4 is stopped by blocking the exit portion of the slit 4 by the blocking plates 24. Therefore, it is possible to optionally change coating widths by moving the blocking plates 24. Moreover, to keep the coating thickness on the base material constant, it is important to make the gap between the nozzle 1 and the base material 8 constant. If the gap fluctuates, for example, the gap is widened, the coating thickness locally increases though a discharge quantity is constant. In the case of this embodiment, a mechanism for keeping the gap constant is not restricted. For example, however, it is also possible to use means for keeping the gap constant by fixing the nozzle 1 and moving the table 9 with the base material 8 fixed on a surface plate.

Figure 17:
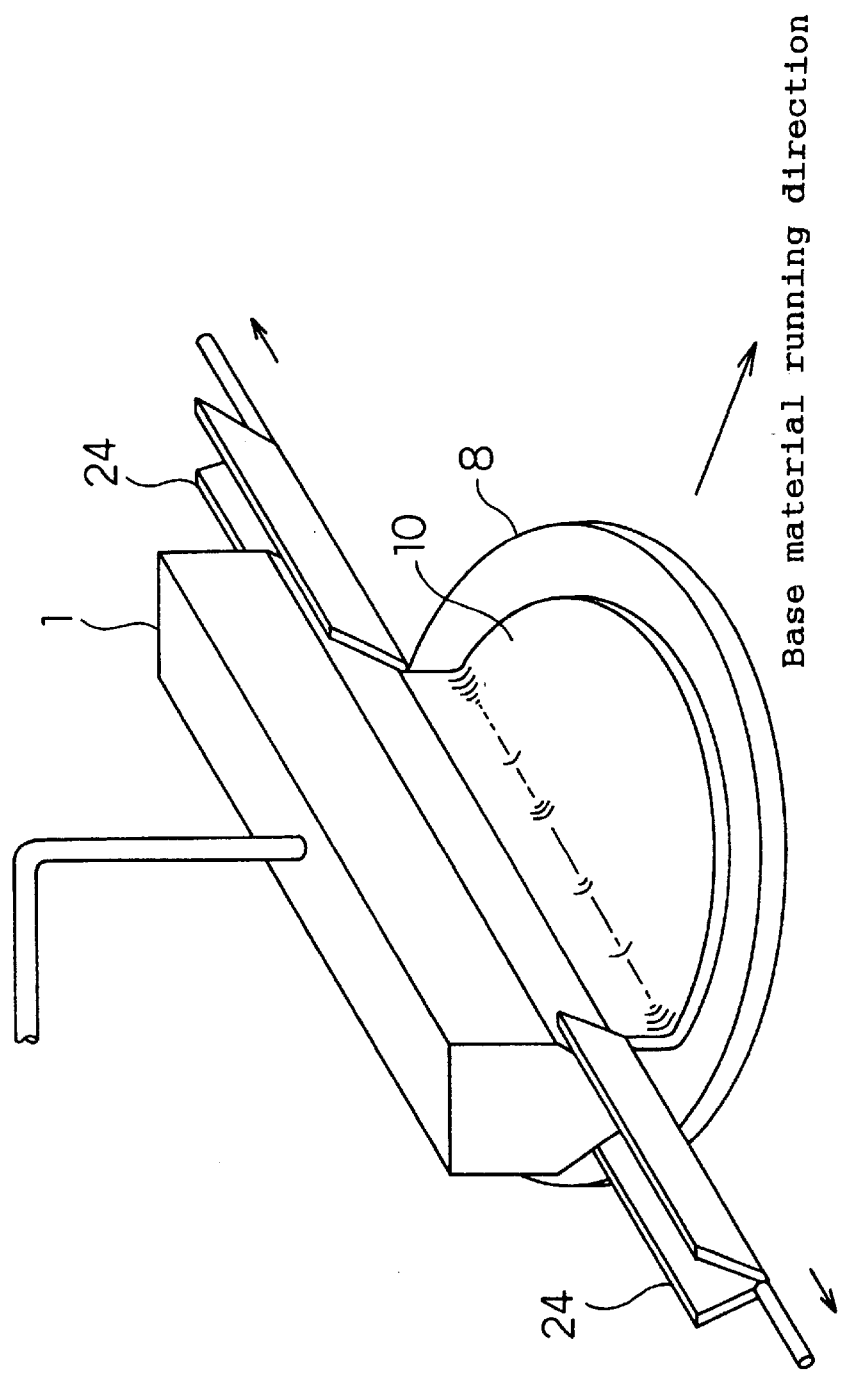
FIG. 17 is a perspective view showing the coating method of the third embodiment of the present invention.

FIG. 17 is a schematic view showing a state in which resist serving as the coating solution 7 is almost circularly applied onto the base material 8 by this embodiment. The coating thickness is 1:m after drying, the thickness fluctuation is kept within "1%, and the loss of the resist can be decreased to zero by this embodiment.

This embodiment makes it possible to further uniform the coating thickness on the base material 8 by using a system for keeping the pressure in the nozzle 1 constant by the means for supplying the coating solution to the nozzle 1 described in the embodiment 1, keeping the gap between the nozzle 1 and the base material 8 constant, and moving the blocking plates 24 for blocking the exit portion of the slit 4. Moreover, to apply resist onto a substantially circular wafer substantially circularly, it is possible to effectively apply the resist onto the wafer without excessively using the expensive resist like the conventional spin coating method and thus, greatly decrease the cost. Furthermore, it is possible to perform coating in an optional pattern.

Embodiment 4

Figure 20:
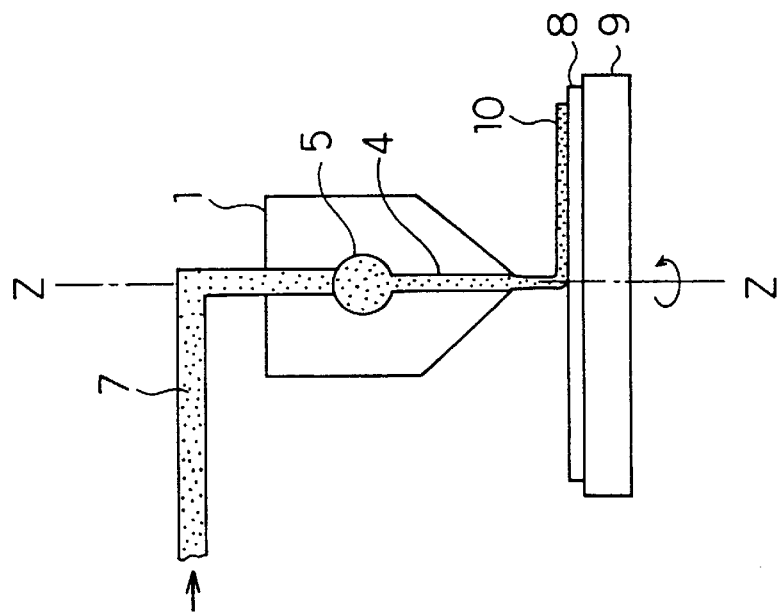
FIG. 20 is a sectional view of the coating portion of the fourth and fifth embodiments of the present invention.
Figure 19:
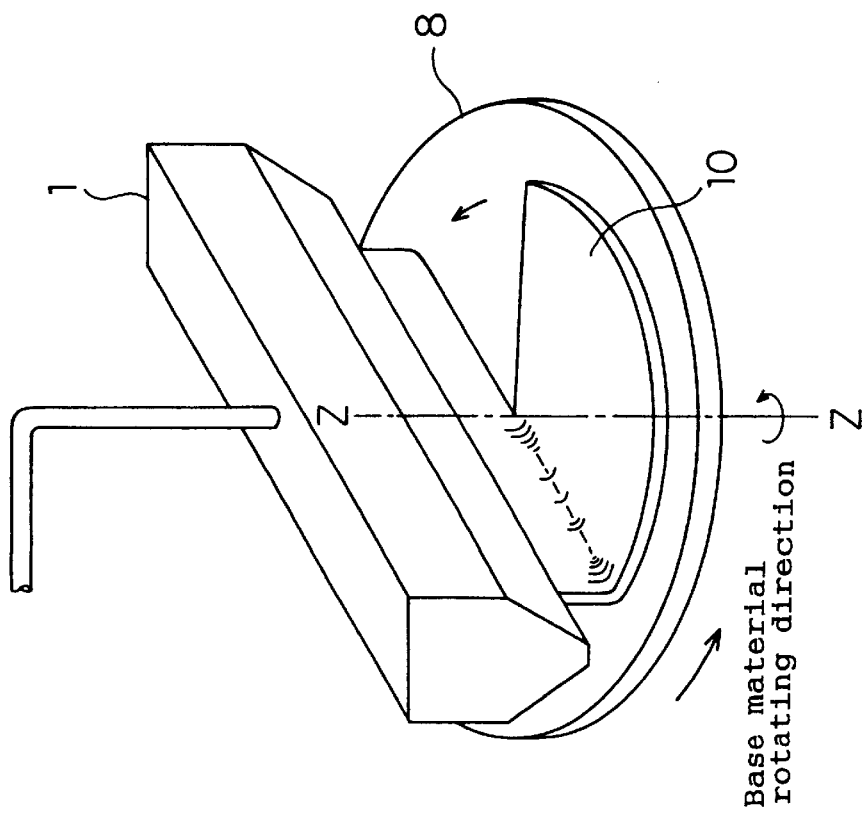
FIG. 19 is a perspective view showing the coating method of the fourth and fifth embodiments of the present invention.
Figure 21:
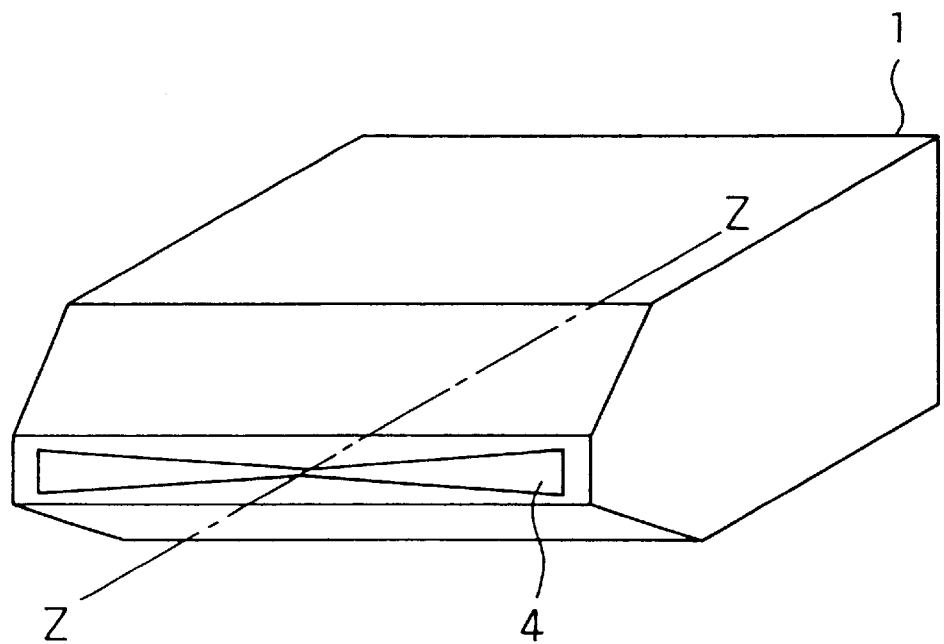
FIG. 21 is a perspective view of the nozzle of the fourth embodiment of the present invention.
Figure 22:
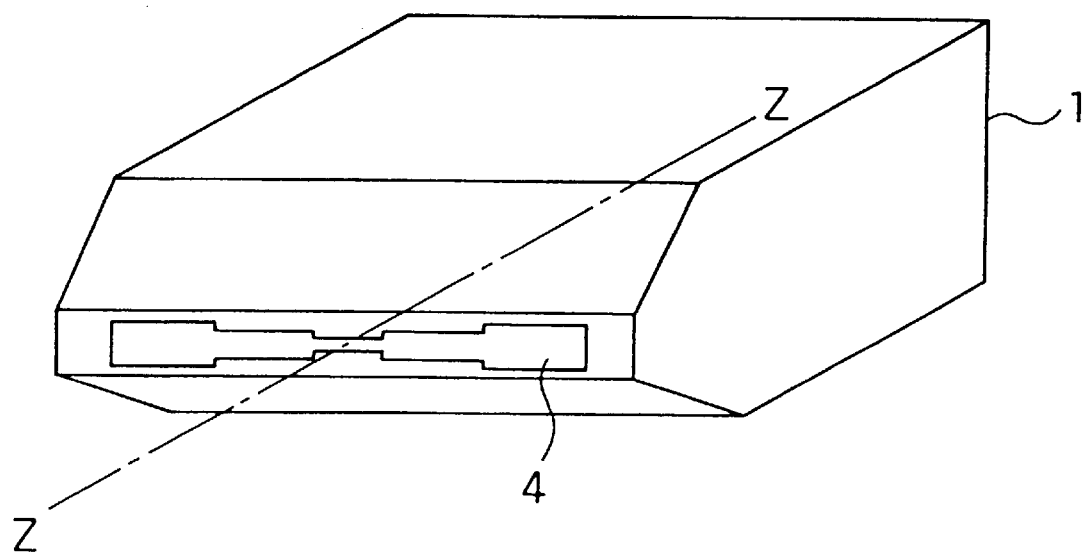
FIG. 22 is a perspective view of the nozzle of the fourth embodiment of the present invention.

FIGS. 19 to 22 show schematic views of the coating method of the fourth embodiment of the present invention. The structure of the coating apparatus of the fourth embodiment of the present invention is described below. FIG. 20 is a local sectional view of the apparatus in FIG. 19 when applying a coating solution. A slit gap of a nozzle 1 is gradually widened from the central axis Z—Z toward the both ends as shown in FIGS. 21, 22, in which a base material 8 is rotated about the rotational center of the central axis Z—Z of the nozzle 1 to circularly apply a coating solution 7 as shown in FIG. 19. It is also possible to rotate the nozzle 1 while fixing the base material 8. The slit gap of the nozzle 1 is properly selected in accordance with the rotational speed and coating thickness of the base material 8 or nozzle 1 and the viscosity of the coating solution 7.

Operations of the coating apparatus of this embodiment are described below. The coating solution 7 is supplied to a manifold 5 of the nozzle 1 by the liquid transfer system such as a force feed system or cylinder system shown in FIG. 7, uniformly discharged from the slit 4 in a coating width direction, and applied onto the base material 8 set on a table 9. The coating method includes a case of completing coating at one time by rotating the base material 8 or nozzle 1 up to 180E and a case of rotating the base material 8 or nozzle 1 many times in accordance with a coating thickness. In short, the base material 8 or nozzle 1 is rotated in accordance with the coating thickness.

FIG. 19 is a schematic view showing resist serving as the coating solution 7 is substantially circularly applied onto the base material 8 by this embodiment. The coating thickness is 1:m after drying, the thickness fluctuation is kept within "1%, and the loss of the resist can be decreased to zero by this embodiment.

Figure 7:
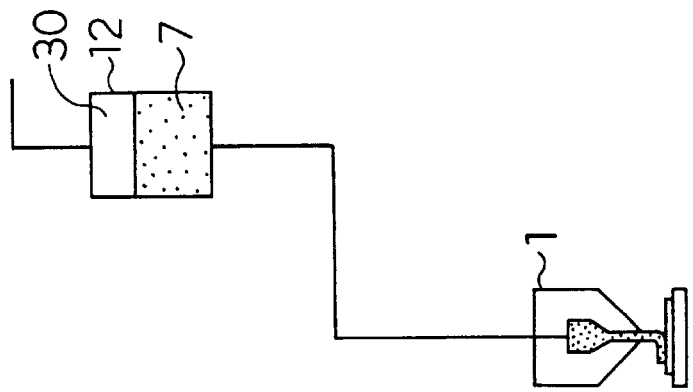
FIG. 7 is a schematic block diagram showing the coating-solution supply system of the fourth embodiment of the present invention.

This embodiment makes it possible to further uniform the coating thickness on the base material 8 by keeping the liquid pressure in the manifold 5 constant in accordance with the force feed system shown in FIG. 7 or, though not illustrated, a feedback system obtained by combining liquid transfer means by a pump with a pressure sensor and by using a system for keeping the pressure in the nozzle 1 constant and properly selecting the slit gap of the nozzle 1 in accordance with the rotational speed and coating thickness of the base material 8 or nozzle 1 and the viscosity of the coating solution 7. Moreover, to apply resist onto a substantially circular wafer substantially circularly, it is possible to effectively apply the resist onto the wafer without excessively using the expensive resist like the conventional spin coating method and greatly decrease the cost.

Embodiment 5

FIGS. 23 to 25 and FIG. 20 show schematic views of the coating apparatus of the fifth embodiment of the present invention.

Figure 23:
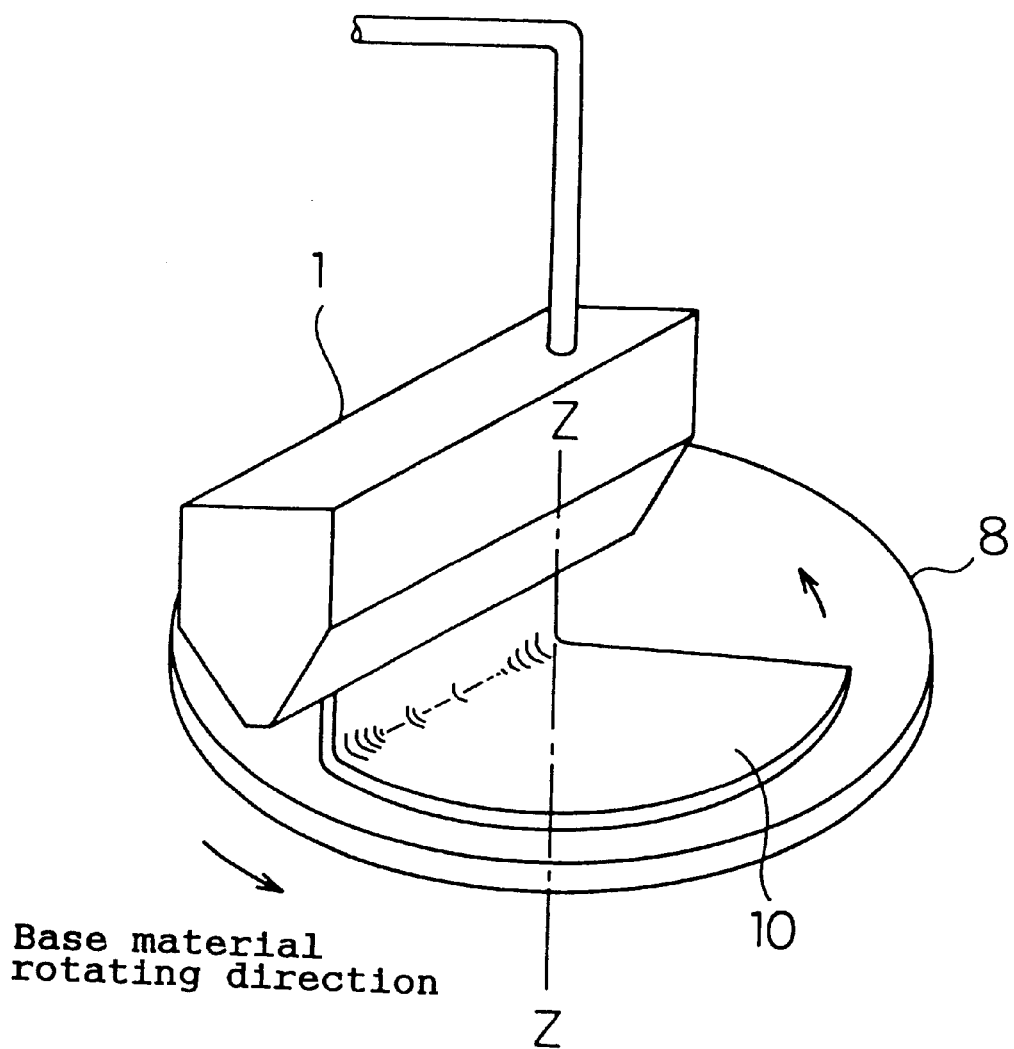
FIG. 23 is a perspective view showing the coating method of the fifth embodiment of the present invention.
Figure 24:
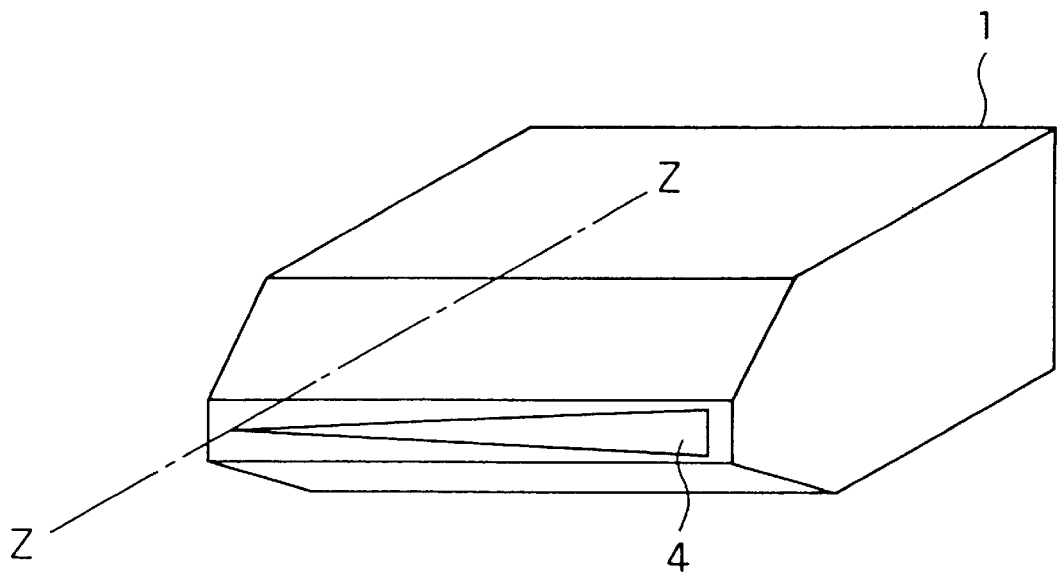
FIG. 24 is a perspective view of the nozzle of the fifth embodiment of the present invention.
Figure 25:
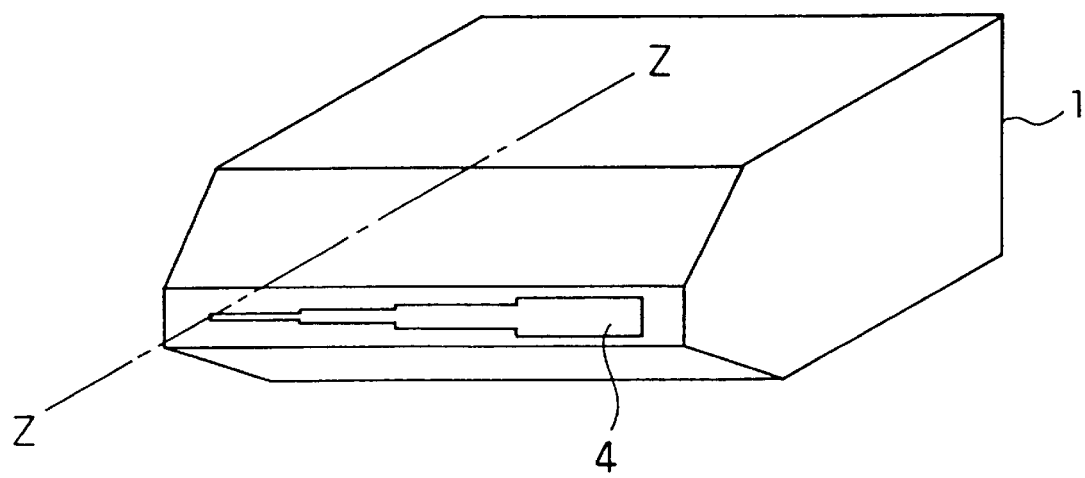
FIG. 25 is a perspective view of the nozzle of the fifth embodiment of the present invention.

The structure of the coating apparatus of the fifth embodiment of the present invention is described below. The slit gap of a nozzle 1 is widened from the axis Z—Z of one end of the slit toward the other end as shown in FIGS. 24, 25 and a coating solution 7 is circularly applied by rotating a base material about the axis Z—Z of the nozzle 1 as shown in FIG. 23. Moreover, it is possible to rotate the nozzle 1 while fixing the base material 8. The slit gap of the nozzle 1 is properly selected in accordance with the rotational speed and coating thickness of the base material 8 or nozzle 1 and the viscosity of the coating solution 7.

Operations of the coating apparatus of this embodiment are described below. FIG. 20 is a local sectional view of the apparatus in FIG. 23 when applying the coating solution. The coating solution 7 is supplied to a manifold 5 by a liquid transfer system such as a force feed system, pump system, or cylinder system, uniformly discharged from a slit 4 in a coating width direction, and applied onto the base material 8 set on a table 9. The coating method includes a case of completing coating at one time coating by rotating the base material 8 or nozzle 1 up to 360E and a case of rotating the base material 8 or nozzle 1 many times in accordance with the coating thickness. In short, the base material 8 or nozzle 1 is rotated in accordance with the coating thickness. FIG. 23 is a schematic view showing a state in which resist serving as a coating solution is substantially circularly applied onto the base material 8 by this embodiment. The coating thickness is 1:m after drying, the thickness fluctuation is kept within "1%, and the loss of the resist can be decreased to zero by this embodiment.

This embodiment makes it possible to further uniform the coating thickness on the base material 8 by keeping the liquid pressure in the manifold 5 constant in accordance with the force feed system shown in FIG. 7 or, though not illustrated, a feedback system obtained by combining liquid transfer means by a pump with a pressure sensor and by using a system for keeping the pressure in the nozzle 1 constant and properly selecting the slit gap of the nozzle 1 in accordance with the rotational speed and coating thickness of the base material 8 or nozzle 1 and the viscosity of the coating solution 7. Moreover, to apply resist onto a substantially circular wafer substantially circularly, it is possible to effectively apply the resist onto the wafer without excessively using the expensive resist like the conventional spin coating method and greatly decrease the cost.

Embodiment 6

Figure 26:
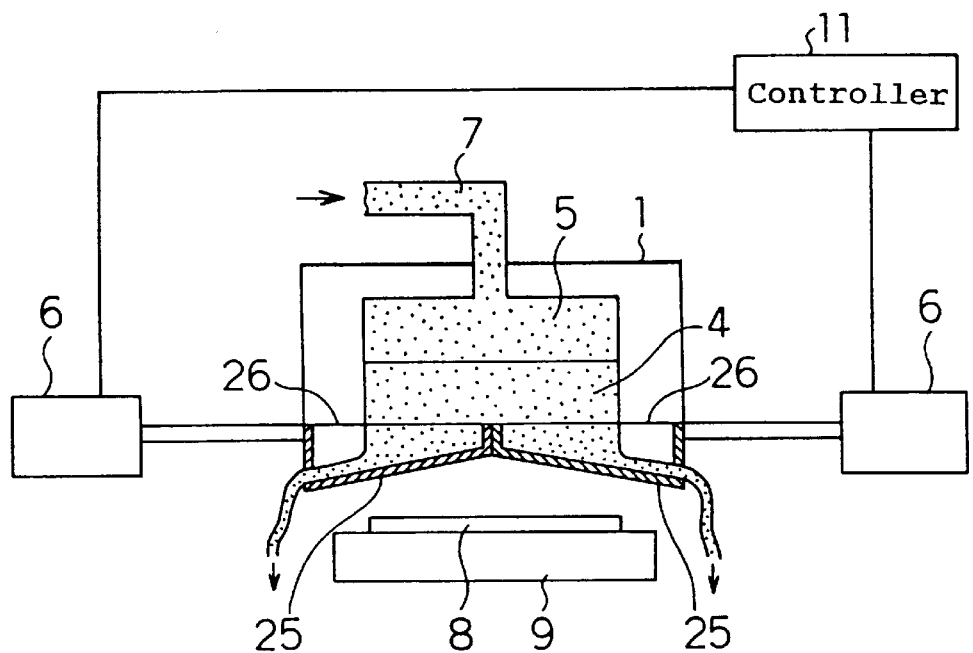
FIG. 26 is a schematic block diagram showing the coating method of the sixth embodiment of the present invention.
Figure 27:
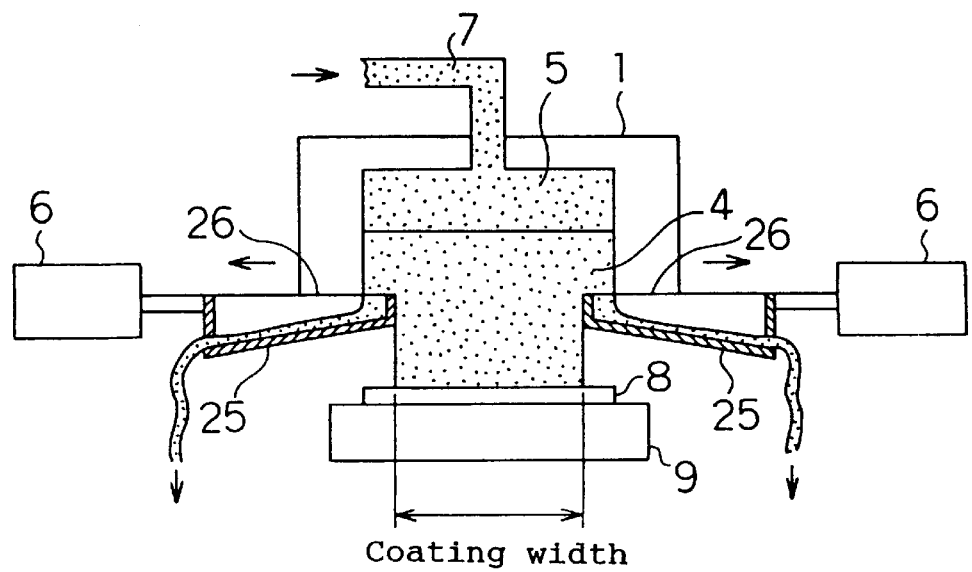
FIG. 27 is a schematic block diagram showing the coating method of the sixth embodiment of the present invention.

FIGS. 26 and 27 show schematic views of an apparatus for executing the coating method of the sixth embodiment of the present invention.

The structure of the apparatus for executing the coating method of the sixth embodiment of the present invention is described below. The exit of a slit 4 is provided with a pair of right and left liquid receivers 25. Each liquid receiver 25 is connected with a moving unit 6 for moving the receiver 25 in a coating width direction. It is also possible to connect the liquid receiver 25 with the moving unit 6 through a bar 3. The moving unit 6 is not restricted and the unit can use any mechanism constituted by combining a servomotor, gear, and belt as long as the mechanism can change coating widths in accordance with a program stored in a controller 11. It is possible to change moving distances of the liquid receiver 25 in accordance with the program stored in the controller 11.

The coating method of this embodiment is described below together with operations of the apparatus. A coating solution 7 is supplied to a manifold 5 of a nozzle 1 by a liquid transfer system such as forced feed system, pump system, or cylinder system, uniformly discharged from the slit 4 in a coating width direction, and applied onto a base material 8 set on a table 9. By moving the liquid receivers 25 to right and left from the central portion of the nozzle 1, slit widths and coating widths are changed. It is also possible to recover the coating solution 7 collected in the liquid receivers 25 and apply it onto the base material 8 again. Moreover, it is possible to dispose the collected solution 7. Furthermore, to keep the coating thickness on the base material, it is. important to make the gap between the nozzle 1 and the base material 8 constant. If the gap fluctuates, for example, the gap is widened, the coating thickness locally increases though the discharge quantity is constant. In the case of this embodiment, though a mechanism for keeping the gap constant is not restricted, it is also possible to keep the gap constant by fixing the nozzle 1 and moving the table 9 with the base material 8 secured on a surface plate.

This embodiment makes it possible to further uniform the coating thickness on the base material 8 by keeping the liquid pressure in the manifold 5 constant in accordance with the force feed system shown in FIG. 7 or, though not illustrated, a feedback system obtained by combining liquid transfer means by a pump with a pressure sensor and keeping the slit gap of the nozzle 1 constant by using a system for keeping the pressure in the nozzle 1 constant. Moreover, to apply resist onto a substantially circular wafer substantially circularly, it is possible to effectively apply the resist onto the wafer without excessively using the expensive resist like the conventional spin coating method by using the liquid receivers 25 and greatly decrease the cost. Furthermore, it is possible to perform coating in an optional pattern.

Embodiment 7

Figure 28:
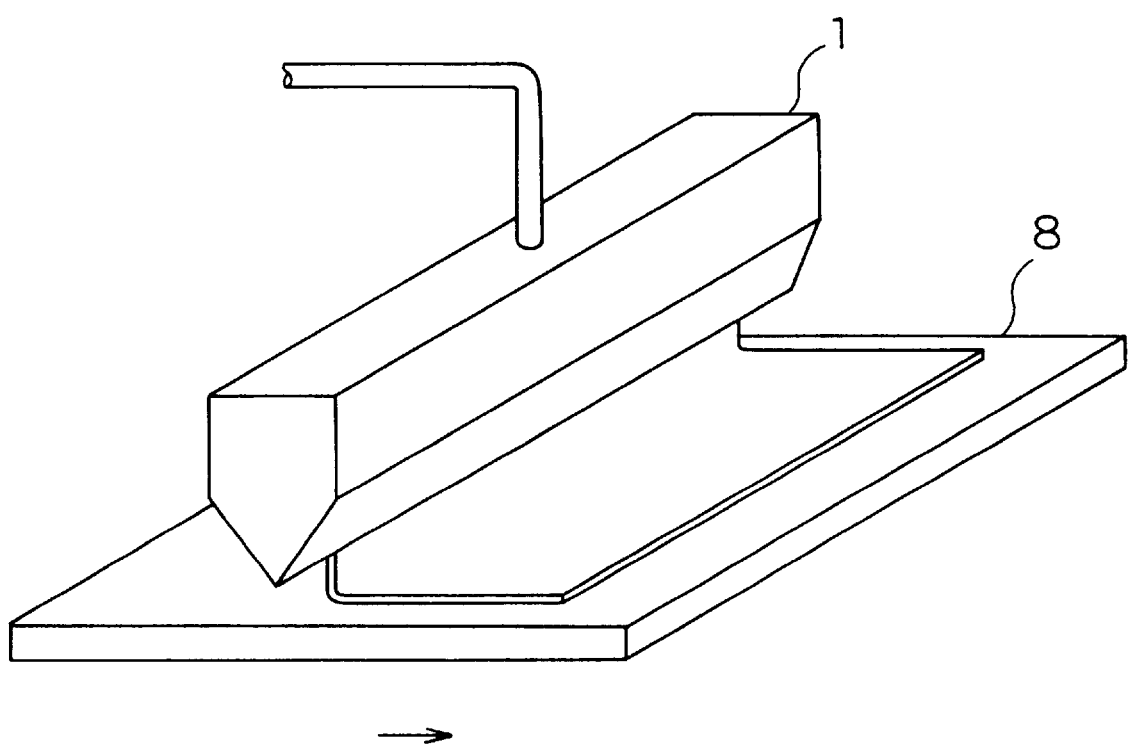
FIG. 28 is a schematic block diagram showing the coating method of the seventh embodiment of the present invention.
Figure 29:
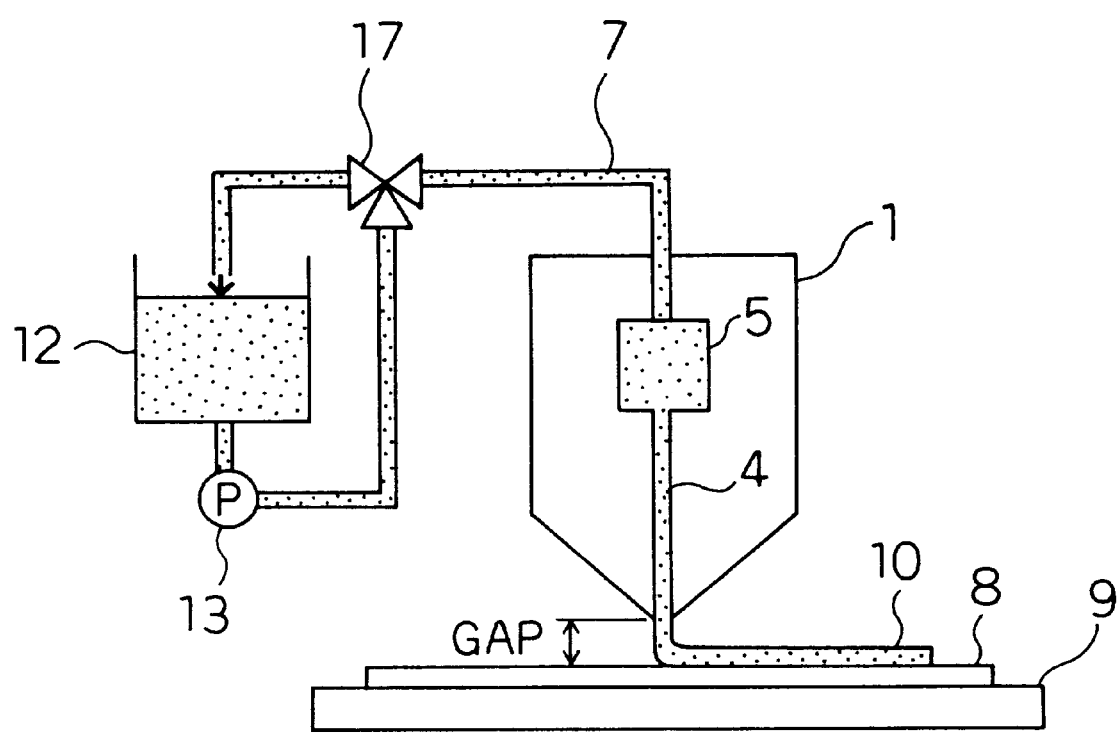
FIG. 29 is a schematic block diagram showing the coating method of the seventh embodiment of the present invention.
Figure 30:
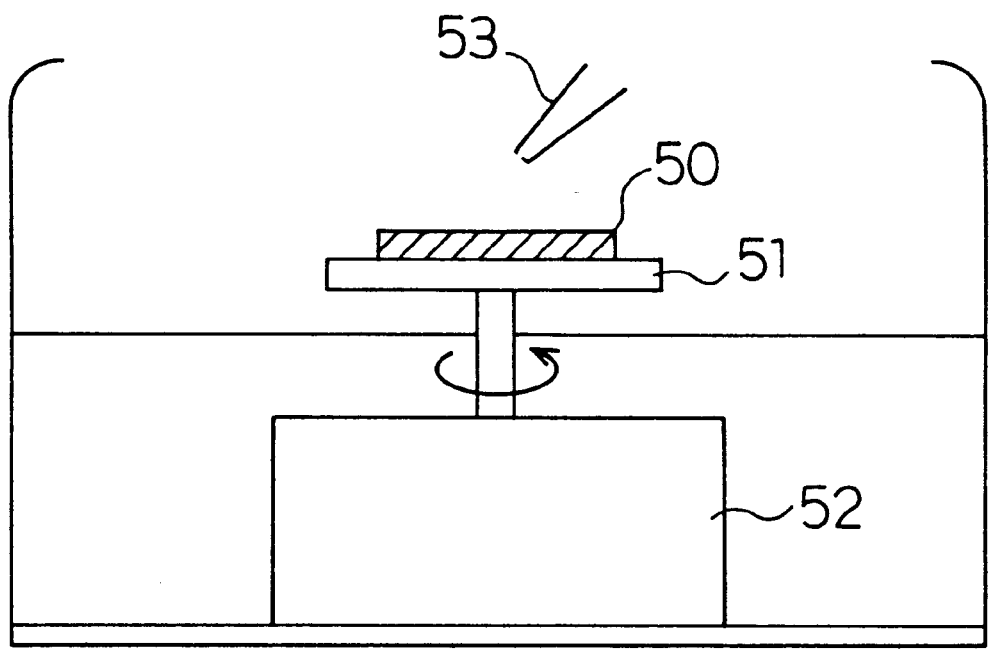
FIG. 30 is an illustration showing the theory of a conventional spin coating method.

FIGS. 28 and 29 show schematic views of an apparatus for executing the coating method of the seventh embodiment of the present invention.

The structure of the apparatus for executing the coating method of the seventh embodiment of the present invention is described below. A nozzle 2 is provided with a manifold 5 and a slit 4 and a predetermined gap is formed between the front end of a nozzle 1 and a base material 8. The gap is optionally set in accordance with a coating thickness. A coating solution 7 is supplied to the nozzle 1 by a pump 13 from a tank 12 through a three-way valve 17. When coating is not performed, the coating solution 7 is returned to the tank 12 by switching the three-way valve 17.

It is the largest feature of this embodiment to slightly discharge the coating solution from the front end of the nozzle 1 immediately before applying the coating solution to the base material 8. Thereby, it is possible to obtain a uniform coating film from the start of coating. A discharge quantity capable of filling the gap between the front end of the nozzle 1 and the base material 8 is necessary. Therefore, the discharge quantity must be changed depending on the gap. According to the past study result, the discharge quantity ranges between 0.001 cc and 1 cc. If the discharge quantity does not reach the range, the state occurs which is the same as the state in which no coating solution is discharged before coating. Therefore, the film thickness of a coating start end becomes too thin or no coating film is formed due to mixing of air. Moreover, if the discharge quantity exceeds the above range, the film thickness of the coating start end becomes too thick, and the quality of the coating film is extremely deteriorated.

The above slight discharge of the coating solution immediately before coating is performed and thereafter, the base material 8 is made to pass under the nozzle 1. By switching the three-way valve 17 simultaneously when the coating start end of the base material 8 passes through the front end of the nozzle 1, supply of the coating solution to the nozzle 1 is started to perform coating. Moreover, by switching the three-way valve 17 simultaneously when the coating termination end of the base material 8 passes through the front end of the nozzle 1, supply of the coating solution to the nozzle 1 is stopped and simultaneously, the coating solution is returned to the tank 12. Thereby, coating can be performed at a uniform thickness from the coating start end up to the coating termination portion.

To apply a coating solution such as resist onto a base material such as a square or rectangular glass plate substantially triangularly, it is possible to effectively apply the solution onto the base material without excessively using the expensive resist solution like the conventional spin coating method, greatly decrease the cost, and remarkably improve the product quality because a coating thickness can be made uniform.

As described above, the present invention makes it possible to apply a coating solution onto a substrate at a uniform thickness in an optional pattern with no loss of the coating solution and thus, greatly decrease the cost and improve the product quality in the fields of semiconductor and liquid crystal requiring the resist process.

What is claimed is:

1. A coating apparatus for coating a substrate, comprising:
   a nozzle, provided with a discharge port slit for applying a coating material onto the substrate;
   blocking means, movable in a coating width direction, to control a width of the discharge port slit of the nozzle, the blocking means comprising:
   a blocking plate, and
   a bar, connected to the plate, for moving the plate; and
   driving means, which includes moving means for moving the blocking means and a controller for controlling a moving distance of the blocking means,
   wherein the width of the discharge port slit is controlled by the lateral movement of the bar and the blocking plate of the blocking means, thereby blocking discharge of the coating material from the nozzle, and
   wherein, a cross section of said bar in a direction (X) substantially perpendicular to said moving direction has a distance A, and a cross section of an internal space of a manifold inside the nozzle in said direction (X) is a distance B, the value of A is less than or equal to one-half the value of B.

2. A coating apparatus for coating a substrate, comprising:
   a nozzle for applying a coating material onto the substrate, provided with a discharge port slit;
   blocking means, inside the nozzle, movable in a coating width direction to control a width of the discharge port slit of the nozzle, the blocking means comprising:

a blocking plate, and a bar, connected to the plate, for moving the plate; and driving means, including moving means for moving the blocking means and a controller for controlling a moving distance of the blocking means, wherein the slit width of the discharge port slit is controlled by a lateral movement of the bar and the blocking plate, and wherein, a cross section of the bar in the direction (X) substantially perpendicular to the moving direction has a distance A, and a cross section of an internal space of a manifold inside the nozzle in direction (X) has a distance B, the value of A is less than or equal to one-half the value of B.

* * * * *

UNITED STATES PATENT AND TRADEMARK OFFICE
CERTIFICATE OF CORRECTION

PATENT NO.   : 6,423,144 B1
DATED        : July 23, 2002
INVENTOR(S)  : Masaru Watanabe It is certified that error appears in the above-identified patent and that said Letters Patent is hereby corrected as shown below:

<u>Title page,</u>
Please insert the following:
-- [30], Foreign Application Priority Data
August 7, 1996 (JP) …………………………..8-207,990 --

Signed and Sealed this

Eighth Day of April, 2003

JAMES E. ROGAN
*Director of the United States Patent and Trademark Office*